(12) United States Patent
Yasui

(10) Patent No.: US 8,423,840 B2
(45) Date of Patent: Apr. 16, 2013

(54) PATTERN GENERATOR

(75) Inventor: Takahiro Yasui, Tokyo (JP)

(73) Assignee: Advantest Corporation, Tokyo (JP)

( * ) Notice: Subject to any disclaimer, the term of this patent is extended or adjusted under 35 U.S.C. 154(b) by 264 days.

(21) Appl. No.: 12/991,830

(22) PCT Filed: May 21, 2008

(86) PCT No.: PCT/JP2008/001274
§ 371 (c)(1),
(2), (4) Date: Feb. 1, 2011

(87) PCT Pub. No.: WO2009/141849
PCT Pub. Date: Nov. 26, 2009

(65) Prior Publication Data
US 2011/0119537 A1 May 19, 2011

(51) Int. Cl.
*G11C 29/00* (2006.01)
(52) U.S. Cl.
USPC .............. 714/718; 714/721; 714/719
(58) Field of Classification Search .......... 714/718, 714/719, 726, 710, 721, 711, 55, 32
See application file for complete search history.

(56) References Cited

U.S. PATENT DOCUMENTS

| | | | | |
|---|---|---|---|---|
| 5,046,113 A | * | 9/1991 | Hoki | 382/147 |
| 5,579,265 A | * | 11/1996 | Devin | 365/200 |
| 6,047,393 A | * | 4/2000 | Yamada | 714/718 |
| 6,108,803 A | * | 8/2000 | Sase | 714/718 |
| 6,154,862 A | * | 11/2000 | Tabata et al. | 714/719 |
| 6,477,672 B1 | * | 11/2002 | Satoh | 714/721 |
| 6,571,353 B1 | * | 5/2003 | Sato | 714/6.32 |
| 6,877,118 B2 | * | 4/2005 | Oshima et al. | 714/719 |

FOREIGN PATENT DOCUMENTS

| | | |
|---|---|---|
| JP | 55-060872 | 5/1980 |
| JP | 59-47265 B2 | 11/1984 |
| JP | 60-18948 B2 | 5/1985 |
| JP | 05-011024 A | 1/1993 |
| JP | 5-128014 A | 5/1993 |
| JP | 09-005402 A | 1/1997 |
| JP | 2915945 B2 | 7/1999 |
| JP | 2000-123597 A | 4/2000 |
| JP | 3271307 B2 | 4/2002 |
| JP | 3937034 B2 | 6/2007 |
| WO | 2004/113941 A1 | 12/2004 |

OTHER PUBLICATIONS

Office Action issued for related Korean Patent Application No. 10-2010-7028627, and its English translation.

(Continued)

*Primary Examiner* — Fritz Alphonse
(74) *Attorney, Agent, or Firm* — Ladas & Parry LLP

(57) ABSTRACT

An address signal generating circuit generates an address signal which designates the address in memory to be accessed. An inversion inhibition signal generating unit generates multiple patterns of inversion inhibition signals each having the same bit width as that of the address signal, and each having a function of preventing particular bits of the address signal from being inverted. A selector selects one of the multiple patterns of inversion inhibition signals generated by the inversion inhibition signal generating unit, and outputs the inversion inhibition signal thus selected. When an inversion control signal is asserted, an address signal inverting circuit inverts only the bits of the address signal which are not prevented from being inverted according to the inversion inhibition signal selected by the selector, and outputs the resulting address signal.

9 Claims, 2 Drawing Sheets

OTHER PUBLICATIONS

PCT International Search Report for PCT Application No. PCT/JP2008/001274 mailed on Aug. 12, 2008, with an English-language translation.

PCT Written Opinion for PCT Application No. PCT/JP2008/001274 mailed on Aug. 12, 2008, with an English-language translation.

PCT International Preliminary Report on Patentability for PCT Application No. PCT/JP2008/001274 mailed on Dec. 2, 2010.

Office Action issued in Japanese Patent Application No. 2010-512848 on Jan. 4, 2011 with an English-language translation.

* cited by examiner

PATTERN GENERATOR

CROSS REFERENCE TO RELATED APPLICATIONS

This application is the U.S. National Stage of International Patent Application No. PCT/JP2008/001274 filed on May 21, 2008 and claims priority thereto, the disclosure of which is hereby incorporated by reference in its entirety.

BACKGROUND OF THE INVENTION

1. Field of the Invention

The present invention relates to a pattern generator employed in a memory test apparatus.

2. Description of the Related Art

As a main storage device for an electronic computer such as a personal computer, a workstation, etc., DRAM (Dynamic Random Access Memory) or SRAM (Static Random Access Memory) is employed.

In a case of testing memory, data is written to a cell in the memory, following which the data thus written is read out, and judgment is made whether or not the data thus read out matches an expected value. Thus, such an arrangement judges the quality of the overall operation of the memory, or identifies a defective cell. Such a test apparatus includes, as an internal circuit, an address signal generating circuit configured to generate an address signal that indicates the address of a cell to be accessed. The test apparatus uses the address signal generated by the address signal generating circuit to read/write data.

In some cases, in order to test the memory in a state near that of actual use, i.e., in a random access manner, the address to be accessed is changed according to a predetermined pattern. In order to provide such a function, in some cases, the test apparatus mounts an address inverting circuit configured to invert all the bits of the address generated according to the pattern program. By employing such an address inverting circuit, such an arrangement is capable of changing the position of the memory cell to be accessed in a simple manner.

Related Patent Documents

Japanese Patent Application Laid Open No. 2000-123597
International Publication WO 2004/113941 pamphlet However, in recent years, memory has a burst transmission function. An address that is used in performing burst transmission, i.e., in general, the lower several bits of a column address, should not be inverted. If such an address is inverted, a cell to be accessed is not accessed.

SUMMARY OF THE INVENTION

The present invention has been made in order to solve such a problem. Accordingly, it is a general purpose of the present invention to provide a signal generator which is capable of controlling a bit inversion operation such that only desired bits are inverted at a desired timing.

An embodiment of the present invention relates to a pattern generator mounted on a memory test apparatus. The pattern generator comprises: an address signal generating circuit configured to generate an address signal which designates an address in the memory to be accessed; an operation inhibition signal generating unit configured to generate multiple patterns of operation inhibition signals each having the same bit width as that of the address signal, and each having a function of preventing particular bits of the address signal from being subjected to an operation; a selector configured to select one from among the plurality of patterns of operation inhibition signals generated by the operation inhibition signal generating unit, and to output the operation inhibition signal thus selected; and an address signal operation circuit configured to receive the address signal, an operation control signal, which is an instruction to perform an operation on the address signal, and the operation inhibition signal selected by the selector, and to perform an operation on only the bits of the address signal that are not prevented from being to subjected to the operation according to the operation inhibition signal when the operation control signal is asserted, and to output the resulting address signal.

With such an embodiment, multiple patterns of operation inhibition signals are prepared beforehand which each define the bits to be allowed to be subjected to an operation and the bits to be prevented from being subjected to the operation. By selecting one of the operation inhibition signals thus prepared, such an arrangement is capable of inverting only the required bits at a required timing according to the operation of the memory which is a device under test.

Also, the selector may select an operation inhibition signal according to the burst length used in a memory burst transmission operation.

By changing the positions of the bits that are allowed to be subjected to an operation according to the burst length, such an arrangement is capable of accessing an appropriate address.

The operation of the address signal operation circuit may be inversion of an address signal. Also, the operation may be conversion of a logical address into a physical address.

Also, the address signal operation circuit may comprise: an AND gate configured to generate the logical AND of a signal that corresponds to the operation inhibition signal selected by the selector and the operation control signal; and an XOR gate configured to generate the logical XOR of each bit of a signal output from the AND gate and a corresponding bit of the address signal.

Also, the operation inhibition signal generating unit may comprise multiple registers configured to store respective multiple patterns of the operation inhibition signals.

Another embodiment of the present invention also relates to a pattern generator mounted on a memory test apparatus. The pattern generator comprises: a data signal generating circuit configured to generate a data signal to be written to the memory; an operation inhibition signal generating unit configured to generate multiple patterns of operation inhibition signals each having the same bit width as that of the data signal, and each having a function of preventing particular bits of the data signal from being subjected to an operation; a selector configured to select one from among the multiple patterns of operation inhibition signals generated by the operation inhibition signal generating unit, and to output the operation inhibition signal thus selected; and a data signal operation circuit configured to receive the data signal, an operation control signal which is an instruction to perform an operation on the data signal, and the operation inhibition signal selected by the selector, to perform an operation on only the bits of the data signal which are not prevented from being to subjected to the operation according to the operation inhibition signal when the operation control signal is asserted, and to output the resulting data signal.

With such an embodiment, multiple patterns of operation inhibition signals are prepared beforehand which each define the bits to be allowed to be subjected to an operation and the bits to be prevented from being subjected to the operation. By selecting one of the operation inhibition signals thus prepared, such an arrangement is capable of inverting only the required bits at a required timing according to the operation of the memory which is a device under test.

Also, the operation of the data signal operation circuit may be an operation for inverting the data signal.

Also, the operation may be an conversion operation according to a predetermined rule.

Also, the data signal operation circuit may comprise: an AND gate configured to generate the logical AND of a signal that corresponds to the operation inhibition signal selected by the selector and the operation control signal; and an XOR gate configured to generate the logical XOR of each bit of a signal output from the AND gate and a corresponding bit of the data signal.

Also, the operation inhibition signal generating unit may comprise multiple registers configured to store respective multiple patterns of the operation inhibition signals.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
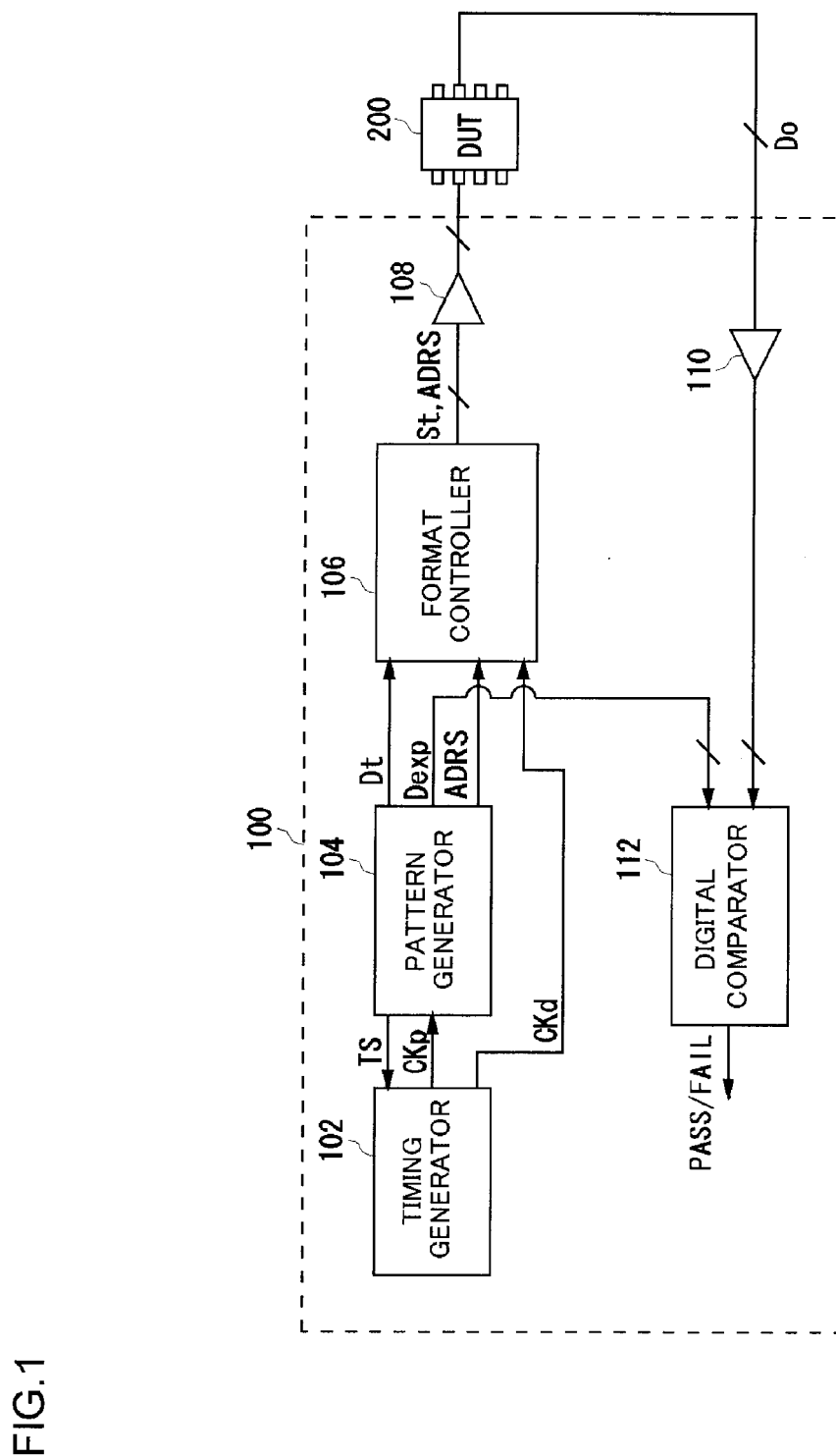
FIG. 1 is a block diagram which shows an overall configuration of a test apparatus according to an embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

FIG. 1 is a block diagram which shows an overall configuration of a test apparatus 100 according to an embodiment. The test apparatus 100 has a function of judging the quality of a DUT 200, or a function of identifying a defect. Description will be made regarding an arrangement in which the DUT 200 is configured as memory (RAM) having a burst transmission function.

The test apparatus 100 comprises a timing generator 102, a pattern generator 104, a format controller 106, a write driver 108, a comparator 110, and a digital comparator 112.

The pattern generator 104 generates a timing set signal (which will be referred to as the "TS signal" hereafter), and supplies the timing set signal thus generated to the timing generator 102. The timing generator 102 generates a cycle clock CKp and a delayed clock CKd according to the timing data specified by the TS signal. The timing generator 102 supplies the cycle clock CKp thus generated to the pattern generator 104, and supplies the delayed clock CKd thus generated to the format controller 106. Subsequently, the pattern generator 104 generates an address signal ADRS that indicates each of the blocks, which are the multiple storage regions included in the DUT 200, and multiple test pattern data Dt to be written to the multiple blocks. The pattern generator 104 supplies the address signal ADRS and the test pattern data Dt thus generated to the format controller 106.

The format controller 106 generates a test pattern signal St that corresponds to the test pattern data Dt thus generated by the pattern generator 104, based upon the delayed clock CKd supplied from the timing generator 102. Subsequently, the format controller 106 supplies the address signal ADRS thus supplied from the pattern generator 104 and the test pattern signal St thus generated to the DUT 200 via the write driver 108.

Furthermore, the pattern generator 104 generates expected value data Dexp beforehand, which is output data to be output from the DUT 200 according to the address signal ADRS and the test pattern signal St. The pattern generator 104 supplies the expected value data Dexp thus generated to the digital comparator 112.

The comparator 110 reads out data Do from a cell of the DUT 200 according to the address signal ADRS, and outputs the data Do thus read out to the digital comparator 112. The digital comparator 112 compares the data Do read out from the DUT 200 with the expected value data Dexp supplied from the pattern generator 104, thereby judging the quality of the DUT 200.

The test apparatus 100 changes the address signal ADRS, which is generated by the pattern generator 104, according to a predetermined rule in order to efficiently test cells at various addresses in a state near that of actual use. For example, the pattern generator 104 performs a bit inversion operation on the address signal ADRS thus generated, and uses the address ADRS' thus inverted to access the memory. The pattern generator 104 includes an address signal inverting circuit configured to invert the bits of the address signal ADRS.

Figure 2:
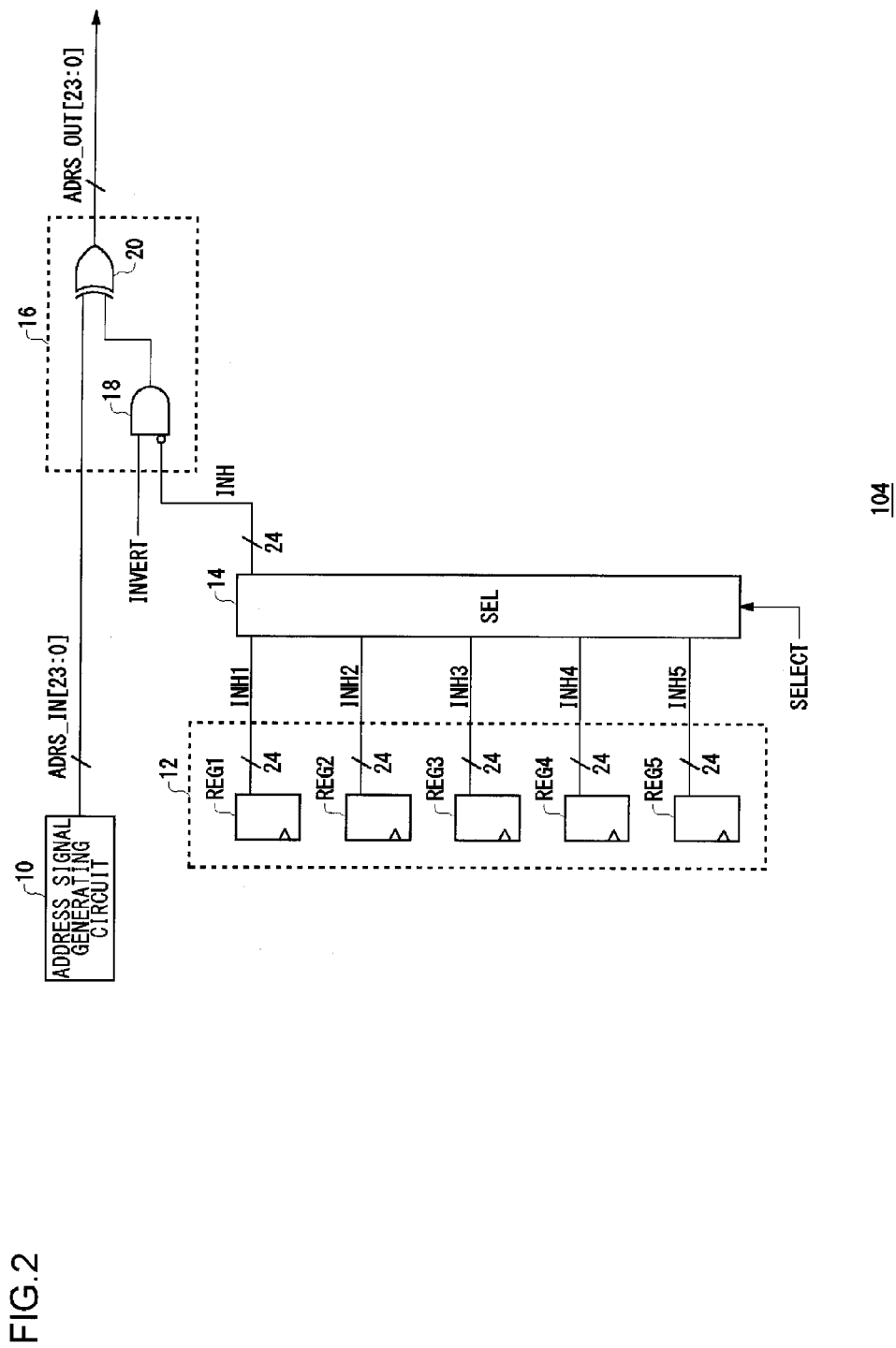
FIG. 2 is a block diagram which shows a configuration of a pattern generator having an address inverting function.

FIG. 2 is a block diagram which shows a configuration of the pattern generator 104 having an address inverting function. The pattern generator 104 includes an address signal generating circuit 10, an inversion inhibition signal generating unit 12, a selector 14, and an address signal inverting circuit 16. Such components described in the present specification in the form of functional blocks that provide various processing can be realized by hardware means, e.g., by means of a CPU, memory, and other LSIs, or by software means, e.g., by means of a program loaded into memory. Accordingly, such functional blocks can be realized by hardware components alone, software components alone, or various combinations thereof, which can be readily conceived by those skilled in this art. That is to say, each functional block is not restricted to hardware components alone or software components alone.

The address signal generating circuit 10 generates an address signal ADRS_IN which indicates an address in the memory to be accessed. The bit width of the address signal ADRS_IN is 24 bits, for example. The inversion inhibition signal generating unit 12 generates multiple patterns of inversion inhibition signals each having the same bit width (24 bits) as that of the address signal ADRS_IN, and each having a function of preventing particular bits from being inverted. The address signal generating circuit 10 according to the present embodiment generates five patterns of inversion inhibition signals INH1[23:0] through INH5[23:0]. When the upper i-th bit of the inversion inhibition signal is set to 1 (asserted), the corresponding upper i-th bit of the address signal ADRS_IN is prevented from being inverted. When the upper i-th bit of the inversion inhibition signal is set to 0

(negated), the corresponding upper i-th bit of the address signal ADRS_IN is allowed to be inverted.

For example, the inversion inhibition signal generating unit 12 can be configured including multiple registers REG1 through REG5 configured to store multiple patterns of inversion inhibition signals INH1 through INH5, respectively. The test apparatus 100 supplies the inversion inhibition signals INH1 through INH5, which are generated according to the pattern program, to the registers REG1 through REG5, respectively.

The selector 14 selects one of the multiple patterns of inversion inhibition signals INH1 through INH5 generated by the inversion inhibition signal generating unit 12, and outputs the inversion inhibition signal thus selected. A selection signal SELECT generated according to the pattern program is input to the selector 14. The selector 14 selects one of the inversion inhibition signals INH1 through INH5 according to the selection signal SELECT.

The address signal inverting circuit 16 receives the address signal ADRS_IN, an inversion control signal INVERT, which is an instruction to invert the address signal ADRS_IN, and an inversion inhibition signal INH selected by the selector 14. When the inversion control signal INVERT is set to 1 (asserted), the address signal ADRS_IN is inverted.

When the inversion control signal INVERT is set to 0 (negated), the address signal ADRS_IN is output without inversion.

When the inversion control signal INVERT is asserted, the address signal inverting circuit 16 inverts only the bits that are not prevented from being inverted, i.e., the bits that are allowed to be inverted, from among the bits of the address signal ADRS_IN, and outputs the resulting address signal.

The address signal inverting circuit 16 includes an AND gate 18 and an XOR gate 20. One input terminal of the AND gate 18 is configured as a logical inversion input terminal. The inversion inhibition signal INH selected by the selector 14 is input to this inverting input terminal. The AND gate 18 calculates the logical AND of a signal that corresponds to the inversion inhibition signal INH and the inversion control signal INVERT. The XOR gate 20 receives the signal output from the AND gate 18 and the address signal ADRS_IN, and generates the logical XOR in these signals thus received.

The test apparatus 100 shown in FIG. 1 accesses the address designated by the address signal ADRS_OUT output from the address signal inverting circuit 16.

The value of the select signal SELECT generated according to the pattern program may be set according to the burst length used to perform burst transmission in the memory access operation. That is to say, the selector 14 selects one of the multiple inversion inhibition signals INH1 through INH5 according to the burst length. For example, when the burst length is 2, the burst address changes only at the least significant bit (LSB). Accordingly, preferably only the least significant bit is prevented from being inverted. Thus, the selector 14 should select an inversion inhibition signal INH in which the least significant bit is set to 1 and in which the other bits are set to 0. When the burst length is 4, the selector 14 should select an inversion inhibition signal INH in which the lower two bits including the least significant bit are set to 1, and in which the other bits are set to 0.

In other words, with some of the inversion inhibition signals of the inversion inhibition signals INH1 through INH5 generated by the inversion inhibition signal generating unit 12, the bits to be prevented from being inverted are set to 1 and the other bits are set to 0 according to one of the corresponding multiple possible burst lengths.

Also, some of the inversion inhibition signals INH1 through INH5 may be used as production rules used to perform address conversion. For example, by setting the inversion inhibition signal to a signal "1, 0, 1, 0, . . ." with the bits alternating between 1 and 0, or to a signal with a given number of upper bits set to 0 and with the other lower bits set to 1, such an arrangement is capable of generating multiple address signals ADRS_OUT based upon a single address signal ADRS_IN.

The above is the overall configuration of the test apparatus 100. Next, description will be made regarding the operation thereof. The test apparatus 100 shown in FIG. 1 sequentially generates the address signals ADRS_IN according to the pattern program in a state in which the inversion control signal INVERT is negated, thereby testing the DUT 200. That is to say, a series of tests is executed in a state in which each address signal ADRS_IN is equal to the corresponding address signal ADRS_OUT.

After the series of tests is completed, the test apparatus 100 sequentially generates the address signals ADRS_IN according to the same pattern program in the state in which the inversion control signal INVERT is asserted. As a result, such an arrangement generates the address signal ADRS_OUT by inverting the bits of the address signal ADRS_IN that are allowed to be inverted according to the inversion inhibition signal INH. The test apparatus 100 performs memory access based upon the resulting address signal ADRS_OUT.

In a case of testing the DUT 200 in a burst transmission state, the test apparatus 100 changes the burst length according to the pattern program, and changes the select signal SELECT according to the burst length thus changed. As a result, such an arrangement selects the inversion inhibition signal set according to the burst length. Thus, such an arrangement is capable of inverting only the required bits of the address signal ADRS_IN at a required timing.

That is to say, with the test apparatus 100 according to the embodiment, multiple patterns of inversion inhibition signals are prepared beforehand which each define the bits to be allowed to be inverted, i.e., the bits to be prevented from being inverted. By selecting one of the inversion inhibition signals, such an arrangement is capable of inverting only the required bits at a required timing according to the operation of the memory which is a device under test.

Furthermore, if such an inversion inhibition signal is generated again every time the burst length is changed in a step for setting the bits to be prevented from being inverted according to the burst length, such an arrangement leads to a problem of complicated programming. In contrast, with the test apparatus 100 according to the embodiment, by selecting one of the multiple patterns of inversion inhibition signals, such an arrangement requires only generation of a suitable select signal SELECT according to the pattern program, thereby providing simplified programming.

Description has been made in the embodiment regarding an arrangement in which the address signal is inverted by means of the address signal inverting circuit 16. However, the present invention is not restricted to such an arrangement in which the inversion operation is performed. Also, the present invention may be extended to a desired circuit configured to perform an operation on each bit of an address signal or data signal. For example, in some cases, the pattern generator mounts an address conversion circuit configured to convert a logical address to a physical address, or to scramble or descramble an address according to a predetermined rule. In this case, such an arrangement may include a conversion inhibition signal generating unit configured to generate a conversion inhibition signal which provides a function of preventing particular bits of an address from being converted. Also, such an arrangement may perform a control operation for whether or not particular bits of the address signal are to be converted according to the conversion inhibition signal.

That is to say, as a generalization of an arrangement described in the embodiment, the following idea is derived.

A pattern generator comprises an address signal generating circuit (10), an operation inhibition signal generating unit (12), a selector (14), and an address signal operation circuit (16). The address signal generating circuit (10) generates an address signal ADRS_IN which designates an address in memory to be accessed. The operation inhibition signal generating unit (12) generates multiple patterns of operation inhibition signals (INH) each having the same bit width as that of the address signal ADRS_IN, and each having a function of preventing particular bits of the address signal from being operated. The selector (14) selects one of the multiple patterns of operation inhibition signals (INH1 through INH5) generated by the operation inhibition signal generating unit (12). The address signal operation circuit (16) receives the address signal ADRS_IN, an operation control signal (INVERT), which is an instruction to perform an operation on the address signal, and the operation inhibition signal (INH) selected by the selector (14). When the operation control signal (INVERT) is asserted, the address operation circuit 16 performs an operation on only the bits of the address signal ADRS_IN that are not prevented from being subjected to an operation according to the operation inhibition signal (INH), and outputs the resulting address signal.

Description has been made regarding an arrangement in which the inverting circuit (or other operation circuits) performs an operation on an address signal. Also, the same architecture can be applied to inversion processing (operation) of a data signal. That is to say, the test apparatus 100 may include a pattern generator 104 configured by replacing the address signal generating circuit 10 shown in FIG. 2 with a data signal generating circuit configured to generate a data signal to be written to the memory. With such a pattern generator 104, the inversion inhibition signals INH1 through INH5 are set to different patterns.

By applying the signal inversion mechanism (signal conversion mechanism) according to the embodiment to inversion of a data signal or to another such operation, the following advantages are obtained.

For example in a case in which some of the inversion inhibition signals INH1 through INH5 store a data signal conversion rule, by generating a data signal by means of the data signal generating circuit according to the pattern program, and by inverting the data signal thus generated using different patterns of inversion inhibition signals, such an arrangement is capable of generating multiple data signals based upon a single data signal. Thus, such an arrangement is capable of testing memory under various conditions.

Description has been made regarding the present invention using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in the appended claims.

What is claimed is:

1. A pattern generator employed in a memory test apparatus, the pattern generator comprising:
   an address signal generating circuit configured to generate an address signal which designates an address to be accessed in a memory under test;
   an operation inhibition signal generating unit configured to generate a plurality of patterns of operation inhibition signals each having the same bit width as that of the address signal, and each having a function of preventing particular bits of the address signal from being subjected to an operation;
   a selector configured to select one from among the plurality of patterns of operation inhibition signals generated by the operation inhibition signal generating unit, and to output the operation inhibition signal thus selected; and
   an address signal operation circuit configured to receive the address signal, an operation control signal, which is an instruction to perform an operation on the address signal, and the operation inhibition signal selected by the selector, and to perform an operation on only the bits of the address signal that are not prevented from being to subjected to the operation according to the operation inhibition signal when the operation control signal is asserted, and to output the resulting address signal.

2. A pattern generator according to claim 1, wherein the selector selects an operation inhibition signal according to the burst length used in a memory burst transmission operation.

3. A pattern generator according to claim 1, wherein the operation of the address signal operation circuit is an operation for inverting the address signal.

4. A pattern generator according to claim 3, wherein the address signal operation circuit comprises:
   an AND gate configured to generate the logical AND of a signal that corresponds to the operation inhibition signal selected by the selector and the operation control signal; and
   an XOR gate configured to generate the logical XOR of each bit of a signal output from the AND gate and a corresponding bit of the address signal.

5. A pattern generator according to claim 1, wherein the operation inhibition signal generating unit comprises a plurality of registers configured to store respective multiple patterns of the operation inhibition signals.

6. A pattern generator employed in a memory test apparatus, the pattern generator comprising:
   a data signal generating circuit configured to generate a data signal to be written to a memory under test;
   an operation inhibition signal generating unit configured to generate a plurality of patterns of operation inhibition signals each having the same bit width as that of the data signal, and each having a function of preventing particular bits of the data signal from being subjected to an operation;
   a selector configured to select one from among the plurality of patterns of operation inhibition signals generated by the operation inhibition signal generating unit, and to output the operation inhibition signal thus selected; and
   a data signal operation circuit configured to receive the data signal, an operation control signal which is an instruction to perform an operation on the data signal, and the operation inhibition signal selected by the selector, to perform an operation on only the bits of the data signal which are not prevented from being to subjected to the operation according to the operation inhibition signal when the operation control signal is asserted, and to output the resulting data signal.

7. A pattern generator according to claim 6, wherein the operation of the data signal operation circuit is an operation for inverting the data signal.

8. A pattern generator according to claim 7, wherein the data signal operation circuit comprises:

an AND gate configured to generate the logical AND of a signal that corresponds to the operation inhibition signal selected by the selector and the operation control signal; and an XOR gate configured to generate the logical XOR of each bit of a signal output from the AND gate and a corresponding bit of the data signal.

9. A pattern generator according to claim 6, wherein the operation inhibition signal generating unit comprises a plurality of registers configured to store respective multiple patterns of the operation inhibition signals.

* * * * *

UNITED STATES PATENT AND TRADEMARK OFFICE
CERTIFICATE OF CORRECTION

PATENT NO.        : 8,423,840 B2
APPLICATION NO. : 12/991830
DATED             : April 16, 2013
INVENTOR(S)       : Takahiro Yasui It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 334 days.

Signed and Sealed this
Eighth Day of September, 2015

Michelle K. Lee
*Director of the United States Patent and Trademark Office*